US007553777B2

(12) United States Patent
Nagai et al.

(10) Patent No.: US 7,553,777 B2
(45) Date of Patent: Jun. 30, 2009

(54) SILICON WAFER LASER PROCESSING METHOD AND LASER BEAM PROCESSING MACHINE

(75) Inventors: Yusuke Nagai, Tokyo (JP); Yukio Morishige, Tokyo (JP); Yosuke Watanabe, Tokyo (JP)

(73) Assignee: Disco Corporation, Tokyo (JP)

( * ) Notice: Subject to any disclaimer, the term of this patent is extended or adjusted under 35 U.S.C. 154(b) by 427 days.

(21) Appl. No.: 11/242,019

(22) Filed: Oct. 4, 2005

(65) Prior Publication Data

US 2006/0079069 A1 Apr. 13, 2006

(30) Foreign Application Priority Data

Oct. 7, 2004 (JP) ............................ 2004-294473

(51) Int. Cl.
*H01L 21/00* (2006.01)

(52) U.S. Cl. ............... 438/795; 438/462; 257/E21.483; 257/E21.475

(58) Field of Classification Search ................. 438/462, 438/463, 799; 257/E21.483, E21.475
See application file for complete search history.

(56) References Cited

U.S. PATENT DOCUMENTS

| | | | | |
|---|---|---|---|---|
| 2003/0209528 | A1 * | 11/2003 | Choo et al. | 219/121.72 |
| 2006/0021978 | A1 * | 2/2006 | Alexeev et al. | 219/121.72 |
| 2006/0160331 | A1 * | 7/2006 | Fukuyo et al. | 438/463 |

FOREIGN PATENT DOCUMENTS

| | | |
|---|---|---|
| JP | 2002192370 | 10/2002 |
| JP | 3408805 | 3/2003 |

* cited by examiner

*Primary Examiner*—Caridad M Everhart
(74) *Attorney, Agent, or Firm*—Smith, Gambrell & Russell, LLP

(57) ABSTRACT

A silicon wafer laser processing method for forming a deteriorated layer along dividing lines formed on a silicon wafer in the inside of the silicon wafer by applying a laser beam along the dividing lines, wherein the wavelength of the laser beam is set to 1,100 to 2,000 nm.

4 Claims, 4 Drawing Sheets

SILICON WAFER LASER PROCESSING METHOD AND LASER BEAM PROCESSING MACHINE

FIELD OF THE INVENTION

The present invention relates to a laser processing method for forming a deteriorated layer along dividing lines in the inside of a silicon wafer by applying a laser beam along the dividing lines formed on the silicon wafer, and to a laser beam processing machine.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a circuit such as IC or LSI is formed in each of the sectioned areas. Individual semiconductor chips are manufactured by cutting this semiconductor wafer along the dividing lines to divide it into the areas having a circuit formed thereon.

Cutting along the dividing lines of the above semiconductor wafer is generally carried out by using a cutting machine called "dicer". Since this cutting machine cuts the semiconductor wafer with a cutting blade having a thickness of about 20 μm, the dividing lines formed on the semiconductor wafer must have a width of about 50 μm. Therefore, the area ratio of the dividing lines to the semiconductor chip becomes high, thereby reducing productivity.

As a means of dividing a plate-like workpiece such as a semiconductor wafer, a laser processing method for applying a pulse laser beam having permeability for the workpiece with its focusing point set to the inside of the area to be divided is also attempted nowadays and disclosed by Japanese Patent No. 3408805. In the dividing method making use of this laser processing technique, the workpiece is divided by applying a pulse laser beam having a wavelength of 1,064 nm, which has permeability for the workpiece, with its focusing point set to the inside, from one surface side of the workpiece to continuously form a deteriorated layer in the inside of the workpiece along the dividing lines and exerting external force along the dividing lines whose strength has been reduced by the formation of the deteriorated layers.

However, the wavelength (1,064 nm) of the pulse laser beam corresponds to an intermediate range from a wavelength range having absorptivity for a silicon wafer up to a wavelength range having permeability for a silicon wafer. Therefore, when a pulse laser beam having a wavelength of 1,064 nm is applied along the dividing lines of a silicon wafer to form a deteriorated layer in the inside of the silicon wafer, multiphoton absorption is not completely carried out in the inside of the silicon wafer and therefore, a satisfactory deteriorated layer is not always formed, thereby making it difficult to divide the silicon wafer along the dividing lines smoothly.

SUMMARY OF THE INVENTION

It is an object of the present invention to provide a silicon wafer laser processing method capable of forming a satisfactory deteriorated layer along dividing lines in the inside of a silicon wafer, and a laser beam processing machine.

To attain the above object, according to the present invention, there is provided a silicon wafer laser processing method for forming a deteriorated layer along dividing lines formed on a silicon wafer in the inside of the silicon wafer by applying a laser beam along the dividing lines, wherein the wavelength of the laser beam is set to 1,100 to 2,000 nm.

Preferably, the wavelength of the laser beam is set to 1,300 to 1,600 nm.

According to the present invention, there is further provided a laser beam processing machine comprising a chuck table for holding a wafer, a laser beam application means for applying a laser beam to the wafer held on the chuck table, and a processing-feed means for moving the chuck table and the laser beam application means relative to each other, wherein the laser beam application means comprises a laser beam oscillation means for oscillating a laser beam having a wavelength of 1,100 to 2,000 nm.

According to the present invention, as a laser beam having a wavelength of 1,100 to 2,000 nm is applied along the dividing lines of the silicon wafer, its permeability for the silicon wafer is high, thereby making it possible to form a deteriorated layer in the inside of the silicon wafer efficiently.

DETAILED DESCRIPTION OF THE PREFERRED EMBODIMENTS

Preferred embodiments of the silicon wafer laser processing method and the laser beam processing machine according to the present invention will be described in detail with reference to the accompanying drawings.

Figure 1:
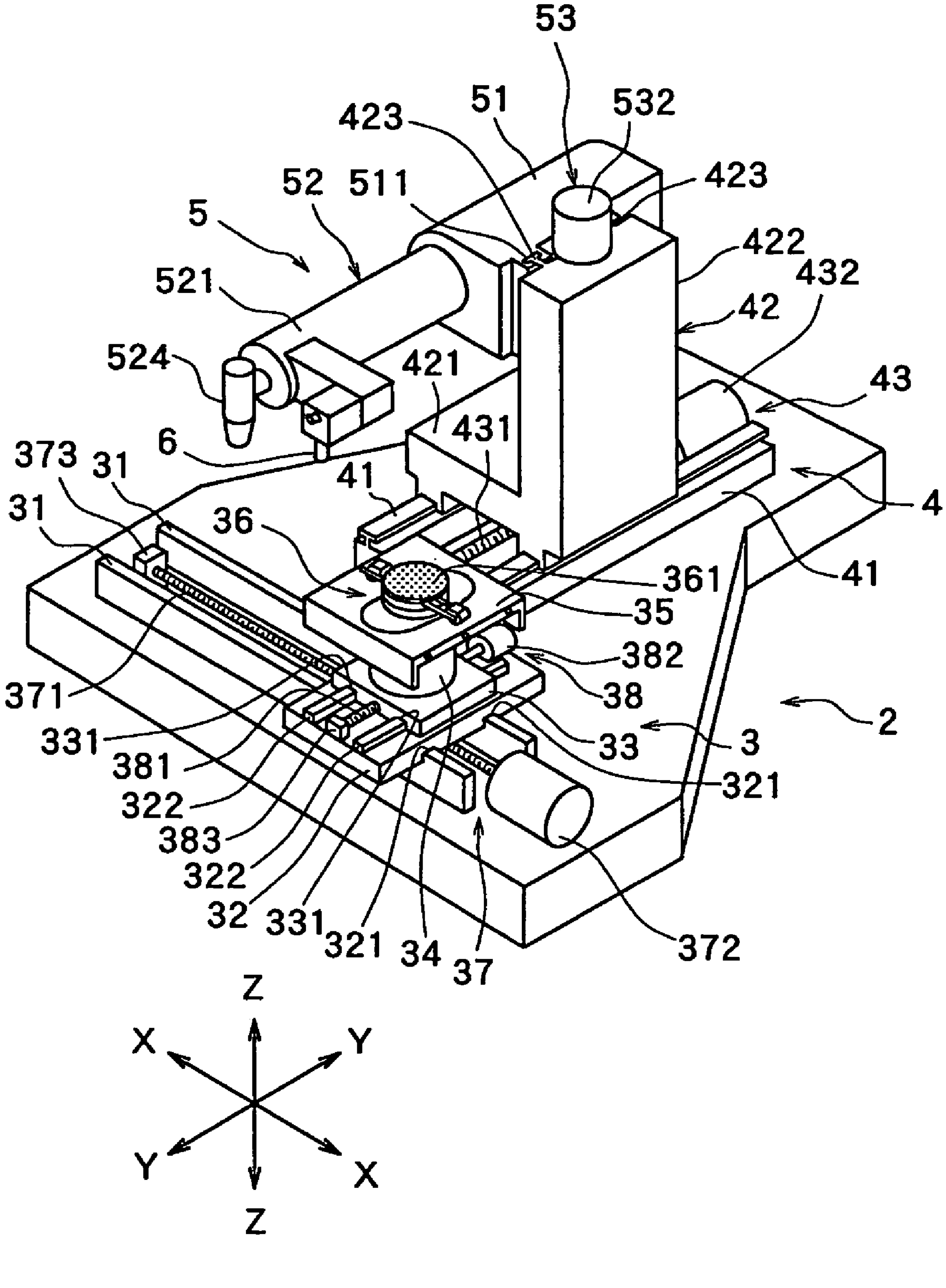
FIG. 1 is a perspective view of a laser beam processing machine constituted according to the present invention.

FIG. 1 is a perspective view of a laser beam processing machine constituted according to the present invention. The laser beam processing machine shown in FIG. 1 comprises a stationary base 2, a chuck table mechanism 3 for holding a workpiece, which is mounted on the stationary base 2 in such a manner that it can move in a processing-feed direction indicated by an arrow X, a laser beam application unit support mechanism 4 that is mounted on the stationary base 2 in such a manner that it can move in an indexing-feed direction indicated by an arrow Y perpendicular to the direction indicated by the arrow X, and a laser beam application unit 5 that is mounted to the laser beam application unit support mechanism 4 in such a manner that it can move in a direction indicated by an arrow Z.

The above chuck table mechanism 3 has a pair of guide rails 31 and 31 that are mounted on the stationary base 2 and arranged parallel to each other in the processing-feed direction indicated by the arrow X, a first sliding block 32 mounted on the guide rails 31 and 31 in such a manner that it can move in the processing-feed direction indicated by the arrow X, a second sliding block 33 mounted on the first sliding block 32 in such a manner that it can move in the indexing-feed direction indicated by the arrow Y, a support table 35 supported on the second sliding block 33 by a cylindrical member 34, and a chuck table 36 as a workpiece holding means. This chuck table 36 has an adsorption chuck 361 made of a porous material so that a disk-like semiconductor wafer as the workpiece is held on the adsorption chuck 361 by a suction means that is not shown. The chuck table 36 is turned by a pulse motor (not shown) installed in the cylindrical member 34.

The above first sliding block 32 has, on the undersurface, a pair of to-be-guided grooves 321 and 321 to be fitted to the above pair of guide rails 31 and 31 and has, on the top surface, a pair of guide rails 322 and 322 formed parallel to each other in the indexing-feed direction indicated by the arrow Y. The first sliding block 32 constituted as described above is constituted to be moved in the processing-feed direction indicated by the arrow X along the pair of guide rails 31 and 31 by fitting the to-be-guided grooves 321 and 321 to the pair of guide rails 31 and 31, respectively. The chuck table mechanism 3 in the illustrated embodiment has a processing-feed means 37 for moving the first sliding block 32 along the pair of guide rails 31 and 31 in the processing-feed direction indicated by the arrow X. The processing-feed means 37 comprises a male screw rod 371 that is arranged between the above pair of guide rails 31 and 31 in parallel thereto and a drive source such as a pulse motor 372 for rotary-driving the male screw rod 371. The male screw rod 371 is, at its one end, rotatably supported to a bearing block 373 fixed on the above stationary base 2 and is, at the other end, transmission-coupled to the output shaft of the above pulse motor 372. The male screw rod 371 is screwed into a threaded through-hole formed in a female screw block (not shown) projecting from the undersurface of the center portion of the first sliding block 32. Therefore, by driving the male screw rod 371 in a normal direction or reverse direction with the pulse motor 372, the first sliding block 32 is moved along the guide rails 31 and 31 in the processing-feed direction indicated by the arrow X.

The above second sliding block 33 has, on the undersurface, a pair of to-be-guided grooves 331 and 331 to be fitted to the pair of guide rails 322 and 322 formed on the top surface of the above first sliding block 32 and is constituted to be moved in the indexing-feed direction indicated by the arrow Y by fitting the to-be-guided grooves 331 and 331 to the pair of guide rails 322 and 322, respectively. The chuck table mechanism 3 in the illustrated embodiment has a first indexing-feed means 38 for moving the second sliding block 33 in the indexing-feed direction indicated by the arrow Y along the pair of guide rails 322 and 322 formed on the first sliding block 32. The first indexing means 38 comprises a male screw rod 381 which is arranged between the above pair of guide rails 322 and 322 in parallel thereto and a drive source such as a pulse motor 382 for rotary-driving the male screw rod 381. The male screw rod 381 is, at its one end, rotatably supported to a bearing block 383 fixed on the top surface of the above first sliding block 32 and is, at the other end, transmission-coupled to the output shaft of the above pulse motor 382. The male screw rod 381 is screwed into a threaded through-hole formed in a female screw block (not shown) projecting from the undersurface of the center portion of the second sliding block 33. Therefore, by driving the male screw rod 381 in a normal direction or reverse direction with the pulse motor 382, the second sliding block 33 is moved along the guide rails 322 and 322 in the indexing-feed direction indicated by the arrow Y.

The above laser beam application unit support mechanism 4 has a pair of guide rails 41 and 41 that are mounted on the stationary base 2 and arranged parallel to each other in the indexing-feed direction indicated by the arrow Y and a movable support base 42 mounted on the guide rails 41 and 41 in such a manner that it can move in the direction indicated by the arrow Y. This movable support base 42 comprises a movable support portion 421 movably mounted on the guide rails 41 and 41 and a mounting portion 422 mounted on the movable support portion 421. The mounting portion 422 is provided with a pair of guide rails 423 and 423 extending in parallel in the direction indicated by the arrow Z on one of its flanks. The laser beam application unit support mechanism 4 in the illustrated embodiment comprises a second indexing-feed means 43 for moving the movable support base 42 along the pair of guide rails 41 and 41 in the indexing-feed direction indicated by the arrow Y. This second indexing means 43 comprises a male screw rod 431 that is arranged between the above pair of guide rails 41 and 41 in parallel thereto and a drive source such as a pulse motor 432 for rotary-driving the male screw rod 431. The male screw rod 431 is, at its one end, rotatably supported to a bearing block (not shown) fixed on the above stationary base 2 and is, at the other end, which transmission-coupled to the output shaft of the above pulse motor 432. The male screw rod 431 is screwed into a threaded through-hole formed in a female screw block (not shown) projecting from the undersurface of the center portion of the movable support portion 421 constituting the movable support base 42. Therefore, by driving the male screw rod 431 in a normal direction or reverse direction with the pulse motor 432, the movable support base 42 is moved along the guide rails 41 and 41 in the indexing-feed direction indicated by the arrow Y.

The laser beam application unit 5 in the illustrated embodiment has a unit holder 51 and a laser beam application means 52 secured to the unit holder 51. The unit holder 51 has a pair of to-be-guided grooves 511 and 511 to be slidably fitted to the pair of guide rails 423 and 423 mounted on the above mounting portion 422, and is supported in such a manner that it can move in the direction indicated by the arrow Z by fitting the to-be-guided grooves 511 and 511 to the above guide rails 423 and 423, respectively.

Figure 2:
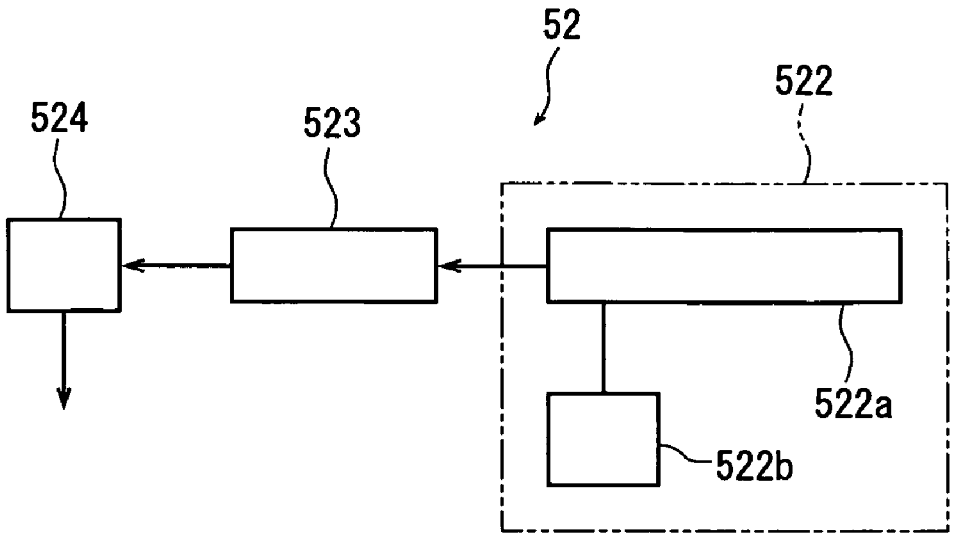
FIG. 2 is a block diagram schematically showing the constitution of laser beam application means provided in the laser beam processing machine shown in FIG. 1.

The illustrated laser beam application means 52 comprises a cylindrical casing 521 that is secured to the above unit holder 51 and extends substantially horizontally. In the casing 521, there are installed a pulse laser beam oscillation means 522 and a transmission optical system 523, as shown in FIG. 2. The pulse laser beam oscillation means 522 is constituted by a pulse laser beam oscillator **522*a* composed of a YAG laser oscillator or YVO4 laser oscillator and a repetition frequency setting means 522*b* connected to the pulse laser beam oscillator 522*a*. The pulse laser beam oscillator 522*a* is designed to oscillate a pulse laser beam having a wavelength of 1,100 to 2,000 nm. The above transmission optical system 523 comprises suitable optical elements such as a beam splitter, etc. A condenser 524 housing a condensing lens (not shown) constituted by a combination of lenses, which may be formation known per se, is attached to the end of the above casing 521**.

Figure 3:
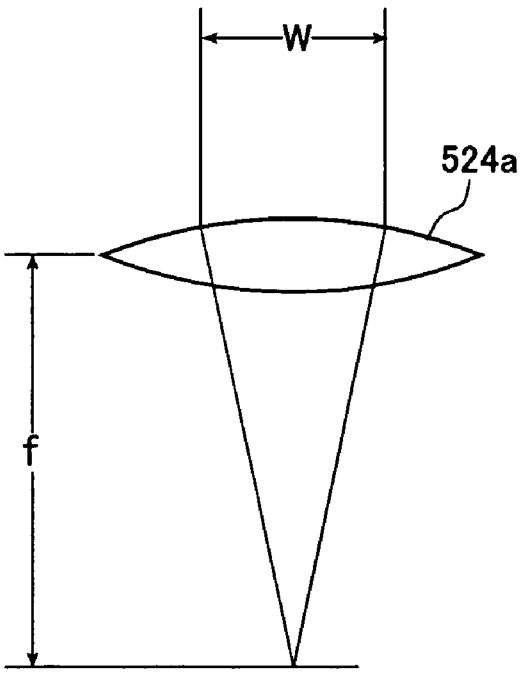
FIG. 3 is a schematic diagram showing the focusing spot diameter of a pulse laser beam.

A laser beam oscillated from the above pulse laser beam oscillation means 522 reaches the condenser 524 through the transmission optical system 523 and is applied from the condenser 524 to the workpiece held on the above chuck table 36 at a predetermined focusing spot diameter D. This focusing spot diameter D is defined by the expression. $D\ (\mu m)=4\times\lambda\times f/(\pi\times W)$ (wherein $\lambda$ is the wavelength (μm) of the pulse laser beam, W is the diameter (mm) of the pulse laser beam applied to an objective lens **524*a*, and f is the focusing distance (mm) of the objective lens 524*a*) when the pulse laser beam showing a Gaussian distribution is applied through the objective lens 524***a* of the condenser 524, as shown in FIG. 3.

Returning to FIG. 1, an image pick-up means 6 is mounted on the front end of the casing 521 constituting the above laser beam application means 52. This image pick-up means 6 is constituted by an infrared illuminating means for applying infrared radiation to the workpiece, an optical system for capturing infrared radiation applied by the infrared illuminating means and an image pick-up device (infrared CCD) for outputting an electric signal corresponding to the infrared radiation captured by the optical system, in addition to an ordinary image pick-up device (CCD) for picking up an image with visible radiation. An image signal is sent to a control means that is not shown.

The laser beam application unit 5 in the illustrated embodiment has a moving means 53 for moving the unit holder 51 along the pair of guide rails 423 and 423 in the direction indicated by the arrow Z. The moving means 53 comprises a male screw rod (not shown) arranged between the pair of guide rails 423 and 423 and a drive source such as a pulse motor 532 for rotary-driving the male screw rod. By driving the male screw rod (not shown) in a normal direction or reverse direction with the pulse motor 532, the unit holder 51 and the laser beam application means 52 are moved along the guide rails 423 and 423 in the direction indicated by the arrow Z. In the illustrated embodiment, the laser beam application means 52 is moved up by driving the pulse motor 532 in a normal direction and moved down by driving the pulse motor 532 in a reverse direction.

The laser beam processing machine in the illustrated embodiment is constituted as described above, and its function will be described hereinbelow.

Figure 4:
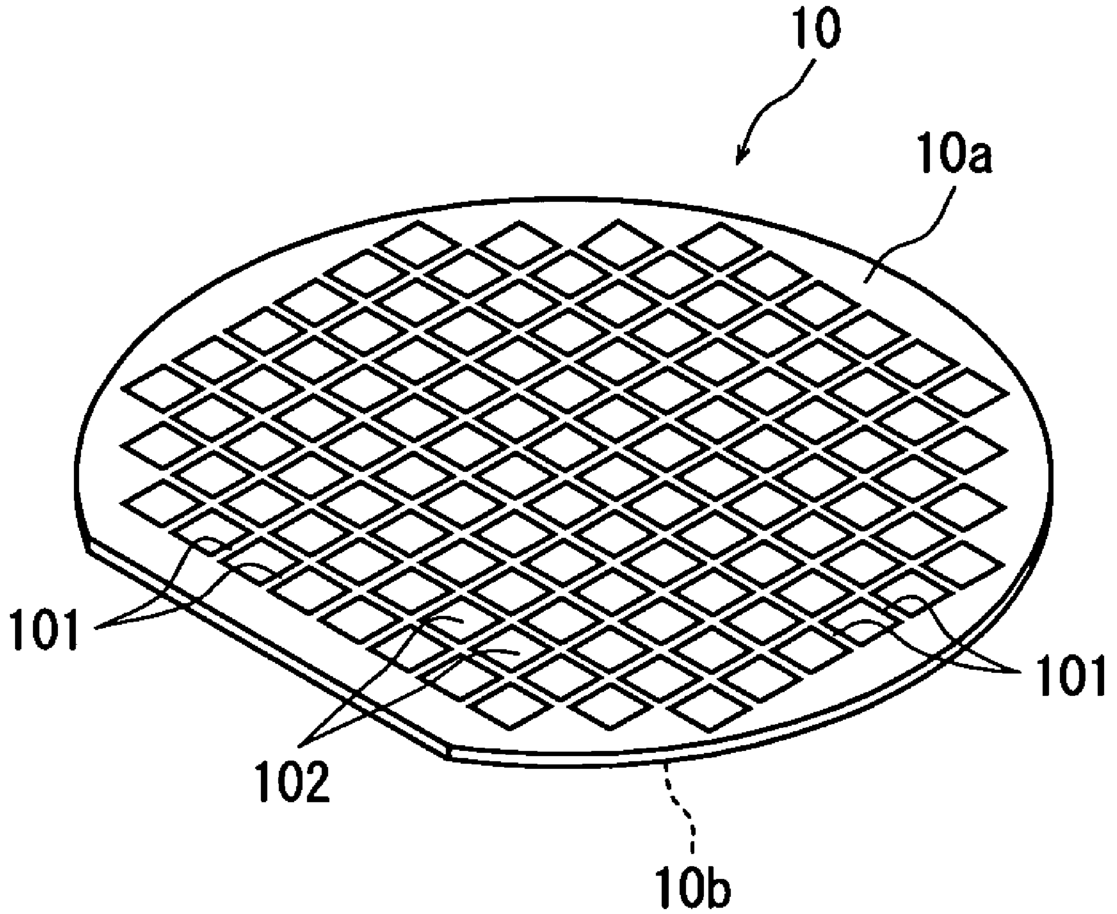
FIG. 4 is a perspective view of a silicon semiconductor wafer to be processed by the laser processing method of the present invention.

FIG. 4 is a perspective view of a semiconductor wafer as a workpiece to be processed. The semiconductor wafer 10 shown in FIG. 4 is a silicon wafer, and a plurality of areas are sectioned by a plurality of dividing lines 101 formed in a lattice pattern on a front surface 10*a,* and a circuit 102 such as IC or LSI is formed in each of the sectioned areas.

A description will be subsequently given of laser processing for forming a deteriorated layer in the inside of the semiconductor wafer 10 along the dividing lines 101 by applying a laser beam along the dividing lines 101 of the above semiconductor wafer 10 by using the above laser beam processing machine 2.

The semiconductor wafer 10 is first placed on the chuck table 36 of the above laser beam processing machine shown in FIG. 1 in such a manner that the back surface 10*b* faces up, and suction-held on the chuck table 36. The chuck table 36 suction-holding the semiconductor wafer 10 is brought to a position right below the image pick-up means 6 by the processing-feed means 37.

After the chuck table 36 is positioned right below the image pick-up means 6, alignment work for detecting the area to be processed of the semiconductor wafer 10 is carried out by using the image pick-up means 6 and the control means that is not shown. That is, the image pick-up means 6 and the control means (not shown) carry out image processing such as pattern matching etc. to align a dividing line 101 formed in a predetermined direction of the semiconductor wafer 10 with the condenser 524 of the laser beam application means 52 for applying a laser beam along the dividing line 101, thereby performing the alignment of a laser beam application position. Further, the alignment of the laser beam application position is also similarly carried out on dividing lines 101 formed on the semiconductor wafer 10 in a direction perpendicular to the predetermined direction. Although the front surface 10*a* on which the dividing line 101 is formed, of the semiconductor wafer 10 faces down at this point, as the image pick-up means 6 comprises the infrared illuminating means and the image pick-up means constituted by an optical system for capturing infrared radiation and an image pick-up device (infrared CCD) for outputting an electric signal corresponding to the infrared radiation as described above, an image of the dividing line 101 can be taken through the back surface 10*b*.

Figure 5:
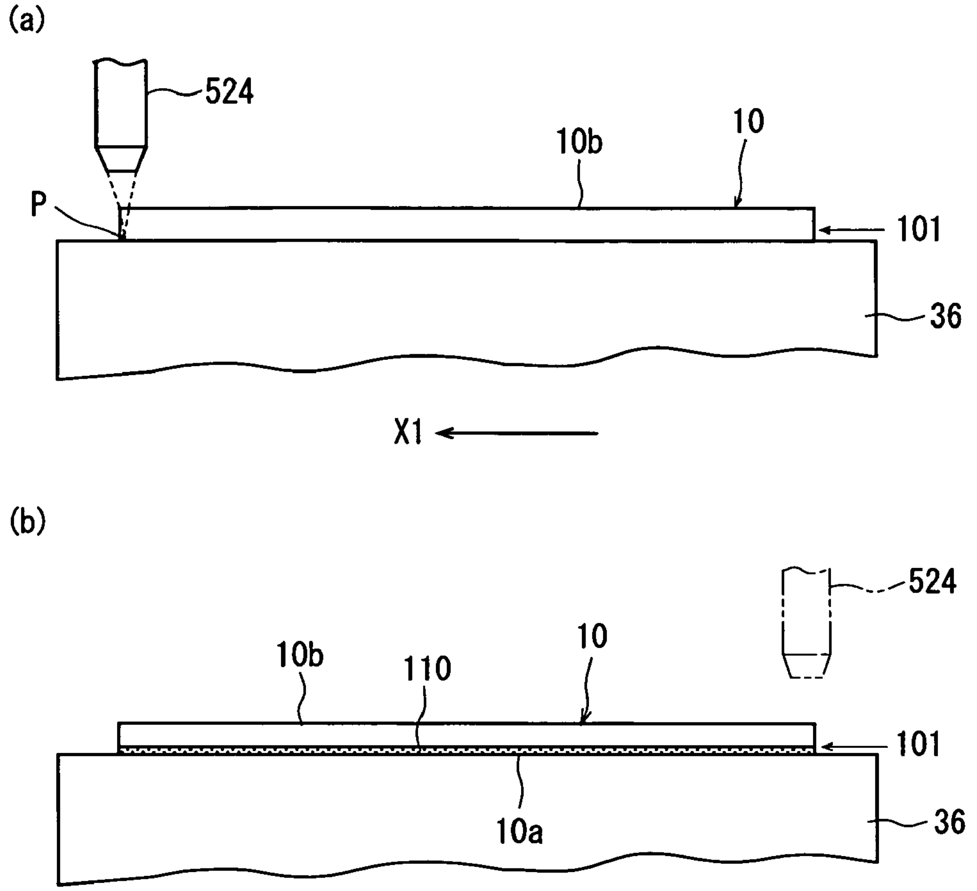
FIGS. 5(*a*) and 5(*b*) are explanatory diagrams showing the deteriorated layer forming step in the laser processing method of the present invention.

After the dividing line 101 formed on the semiconductor wafer 10 held on the chuck table 36 is detected and the alignment of the laser beam application position is carried out as described above, the chuck table 36 is moved to a laser beam application area where the condenser 524 of the laser beam application means 52 for applying a laser beam is located as shown in FIG. 5(*a*) so as to bring one end (left end in FIG. 5(*a*)) of the predetermined dividing line 101 to a position right below the condenser 524 of the laser beam application means 52. The chuck table 36; that is, the semiconductor wafer 10 is then moved in the direction indicated by the arrow X1 in FIG. 5(*a*) at a predetermined processing-feed rate while a pulse laser beam having a wavelength of 1,100 to 2,000 nm, for example, which has permeability for the silicon wafer is applied from the condenser 524. Then, when the application position of the condenser 524 of the laser beam application means 52 reaches the other end of the dividing line 101, as shown in FIG. 5(*b*), the application of the pulse laser beam is suspended and the movement of the chuck table 36, that is, the semiconductor wafer 10 is stopped. In this laser processing step, the focusing point P of the pulse laser beam is set to a position near the front surface 10*a* (undersurface) of the semiconductor wafer 10. As a result, a deteriorated layer 110 is exposed to the front surface 10*a* (undersurface) of the semiconductor wafer 10 and formed from the front surface 10*a* toward the inside. This deteriorated layer 110 is formed as a molten and re-solidified layer (that is, as a layer that is once molten when the pulse laser beam is converged and then, re-solidified after the convergence of the pulse laser beam) to reduce the strength of the semiconductor wafer 10.

The above deteriorated layer 110 may be formed only in the inside without being exposed to the front surface 10*a* and the back surface 10*b,* or a plurality of deteriorated layers 110 may be formed by carrying out the above laser processing a plurality of times by changing the above focusing point P stepwise.

After the above laser processing is carried out along all the dividing lines 21 extending in the predetermined direction of the semiconductor wafer 10, the chuck table 36 is turned at 90° so as to carry out the above laser processing along dividing lines 101 extending in a direction perpendicular to the above predetermined direction. The semiconductor wafer 10 having the deteriorated layer 110 formed along all the dividing lines 101 can be easily ruptured along the dividing lines 101 by exerting external force along the dividing lines 101.

EXPERIMENTAL EXAMPLE 1

Figure 6:
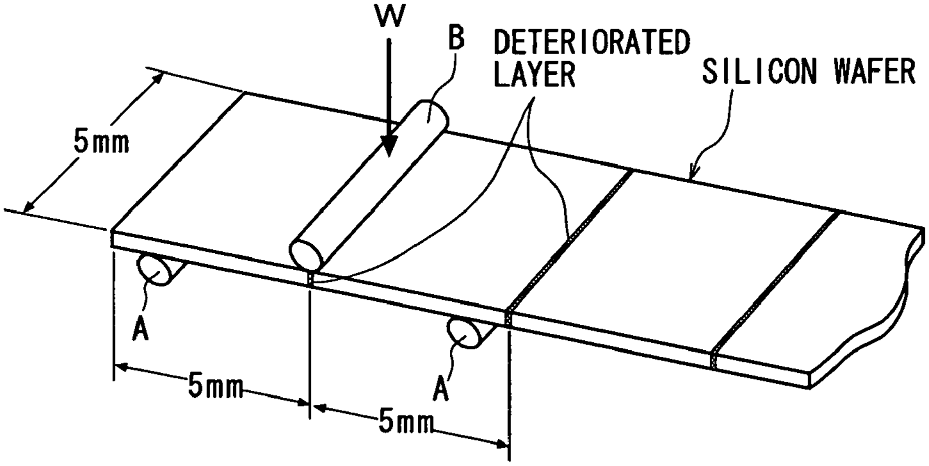
FIG. 6 is an explanatory diagram for a 3-point bending test method.

Dividing lines were formed at intervals of 5 mm in a lattice pattern on a silicon wafer having a diameter of 200 mm and a thickness of 600 μm, and laser processing was carried out along the dividing lines under the following processing conditions by using a pulse laser beam having a wavelength of 1,064 nm to form a deteriorated layer in the inside of the silicon wafer along the dividing lines. One deteriorated layer had a thickness of about 50 μm, and 12 layers formed from this deteriorated layer were formed so that they were exposed to both surfaces of the silicon wafer.

light source: LD excited Q switch Nd:YVO4 laser
wavelength: pulse laser beam having a wavelength of 1,064 nm
repetition frequency: 40 kHz
pulse width: 20 ns
average output: 4 W
focusing spot diameter: 1.0 μm
processing-feed rate: 40 mm/sec The silicon wafer having a deteriorated layer that was formed along the dividing lines under the above processing conditions was subjected to a dividing test to divide it along the dividing lines. In this dividing test, a 3-point bending test was carried out by dividing the silicon wafer having the deteriorated layer formed thereon into a belt-like form having a width of a chip, supporting this belt-like wafer with a pair of fulcrum rolls A and A placed on both sides of the deteriorated layer formed on the wafer at a predetermined distance therebetween, placing a pressing roll B on the deteriorated layer at the top surface of the wafer, and applying a load W to this pressing roll B to obtain a load W required for division, as shown in FIG. 6. In this dividing test, 100 measurement data were collected by dividing the deteriorated layers formed in the belt-like wafer sequentially to obtain a mean value of the data.

As a result of the above test, the mean value of the load W required for division was 3.7 N (newton).

EXPERIMENTAL EXAMPLE 2

Dividing lines were formed at intervals of 5 mm in a lattice pattern on a silicon wafer having a diameter of 200 mm and a thickness of 600 μm, and laser processing was carried out along the dividing lines under the following processing conditions by using a pulse laser beam having a wavelength of 1,340 nm to form a deteriorated layer in the inside of the silicon wafer along the dividing lines. One deteriorated layer had a thickness of about 50 μm like the above Experimental Example 1, and 12 layers formed from this deteriorated layer were formed so that they were exposed to both surfaces of the silicon wafer.

light source: LD excited Q switch Nd:YVO4 laser
wavelength: pulse laser beam having a wavelength of 1,340 nm
repetition frequency: 40 kHz
pulse width: 20 ns
average output: 4 W
focusing spot diameter: 1.3 μm
processing-feed rate: 40 mm/sec The silicon wafer having a deteriorated layer that was formed along the dividing lines under the above processing conditions was subjected to a dividing test in the same manner as in the above Experimental Example 1 to obtain a mean value of 100 measurement data. As a result, the mean value of the load W required for division was 0.5 N (newton).

EXPERIMENTAL EXAMPLE 3

Dividing lines were formed in a lattice pattern on a silicon wafer having a diameter of 200 mm and a thickness of 600 μm at intervals of 5 mm, and laser processing was carried out along the dividing lines under the following processing conditions by using a pulse laser beam having a wavelength of 1,550 nm to form a deteriorated layer in the inside of the silicon wafer along the dividing lines. One deteriorated layer had a thickness of about 50 μm like the above Experimental Examples 1 and 2, and 12 layers formed from this deteriorated layer were formed so that they were exposed to both surfaces of the silicon wafer.

light source: LD excited Q switch Nd:YVO4 laser
wavelength: pulse laser beam having a wavelength of 1,550 nm
repetition frequency: 40 kHz
pulse width: 20 ns
average output: 4 W
focusing spot diameter: 1.5 μm
processing-feed rate: 40 mm/sec The silicon wafer having a deteriorated layer that was formed along the dividing lines under the above processing conditions was subjected to a dividing test in the same manner as in the above Experimental Example 1 to obtain a mean value of 100 measurement data. As a result, the mean value of the load W required for division was 0.7 N (newton).

It is understood from the above experimental results that when the deteriorated layer is formed by using a pulse laser beam having a wavelength of 1,340 nm, the load W required for division is 1/7 or less of the load W required when a pulse laser beam having a wavelength of 1,064 nm is used. It is also understood that when the deteriorated layer is formed by using a pulse laser beam having a wavelength of 1,550 nm, the load W required for division is 1/5 or less of the load W required when a pulse laser beam having a wavelength of 1,064 nm is used. Although a pulse laser beam having a wavelength of 2,000 to 6,500 nm also has high permeability for a silicon wafer, its focusing spot diameter becomes larger as its wavelength becomes longer. When the focusing spot diameter exceeds 3.0 μm, the width of the dividing lines must be made large and the average output of the pulse laser beam must be increased, all of which are not preferred from the viewpoint of productivity. Therefore, in order to form a satisfactory deteriorated layer having a small load W required for division with a pulse laser beam having a focusing spot diameter in a range of 1.0 to 3.0 μm, a pulse laser beam having a wavelength of 1,100 to 2,000 nm is preferred, and a pulse laser beam having a wavelength of 1,300 to 1,600 nm is more preferred.

The processing conditions for forming the above deteriorated layer are an average output of the pulse laser beam of 0.5 to 10 W, a repetition frequency of 10 to 800 kHz, a pulse width of 10 to 1,000 ns, a focusing spot diameter of 1.0 to 3.0 μm and a processing-feed speed of 10 to 1,000 mm/sec.

What is claimed is:

1. A silicon wafer laser processing method for forming a deteriorated layer along dividing lines formed on a silicon wafer in the inside of the silicon wafer by applying a laser beam along the dividing lines, wherein the wavelength of the laser beam is set to 1,100 to 2,000 nm;
the average output of the laser beam is 0.5 to 10 W;
the repetition frequency of the laser beam is 10 to 800 kHz; and
the focusing spot diameter of the laser beam is in a range of 1.0 to 3.0 μm.

2. The laser processing method according to claim 1, wherein the wavelength of the laser beam is set to 1,300to 1,600 nm.

3. The laser processing method according to claim 2, wherein the laser beam is oscillated by an YV04 laser oscillator and the processing-feed rate of the laser beam is 10~1,000 mm/sec.

4. A laser beam processing machine comprising a chuck table for holding a wafer, a laser beam application means for applying a laser beam to the wafer held on the chuck table, and a processing-feed means for moving the chuck table and the laser beam application means relative to each other, wherein the laser beam application means comprises a laser beam oscillation means for oscillating a laser beam having a wavelength of 1,100 to 2,000 nm;

the laser beam application means outputs the laser beam at an average of 0.5 to 10 W, and a repetition frequency from 10 to 800 kHz; and the focusing spot diameter of the laser beam is in a range of 1.0 to 3.0 μm.

* * * * *

US007553777C1

(12) EX PARTE REEXAMINATION CERTIFICATE (9393rd)

United States Patent

Nagai et al.

(10) Number: US 7,553,777 C1
(45) Certificate Issued: Nov. 2, 2012

(54) SILICON WAFER LASER PROCESSING METHOD AND LASER BEAM PROCESSING MACHINE

(75) Inventors: Yusuke Nagai, Tokyo (JP); Yukio Morishige, Tokyo (JP); Yosuke Watanabe, Tokyo (JP)

(73) Assignee: Disco Corporation, Ota-ku, Tokyo (JP)

Reexamination Request:
No. 90/011,949, Oct. 7, 2011

Reexamination Certificate for:

| | |
|---|---|
| Patent No.: | **7,553,777** |
| Issued: | **Jun. 30, 2009** |
| Appl. No.: | **11/242,019** |
| Filed: | **Oct. 4, 2005** |

(30) Foreign Application Priority Data

Oct. 7, 2004 (JP) ................................. 2004-294473

(51) Int. Cl.
*H01L 21/00* (2006.01)

(52) U.S. Cl. ................ 438/795; 438/462; 257/E21.483; 257/E21.475

(58) Field of Classification Search ........................ None
See application file for complete search history.

(56) References Cited

To view the complete listing of prior art documents cited during the proceeding for Reexamination Control Number 90/011,949, please refer to the USPTO's public Patent Application Information Retrieval (PAIR) system under the Display References tab.

*Primary Examiner* — John Heyman

(57) ABSTRACT

A silicon wafer laser processing method for forming a deteriorated layer along dividing lines formed on a silicon wafer in the inside of the silicon wafer by applying a laser beam along the dividing lines, wherein the wavelength of the laser beam is set to 1,100 to 2,000 nm.

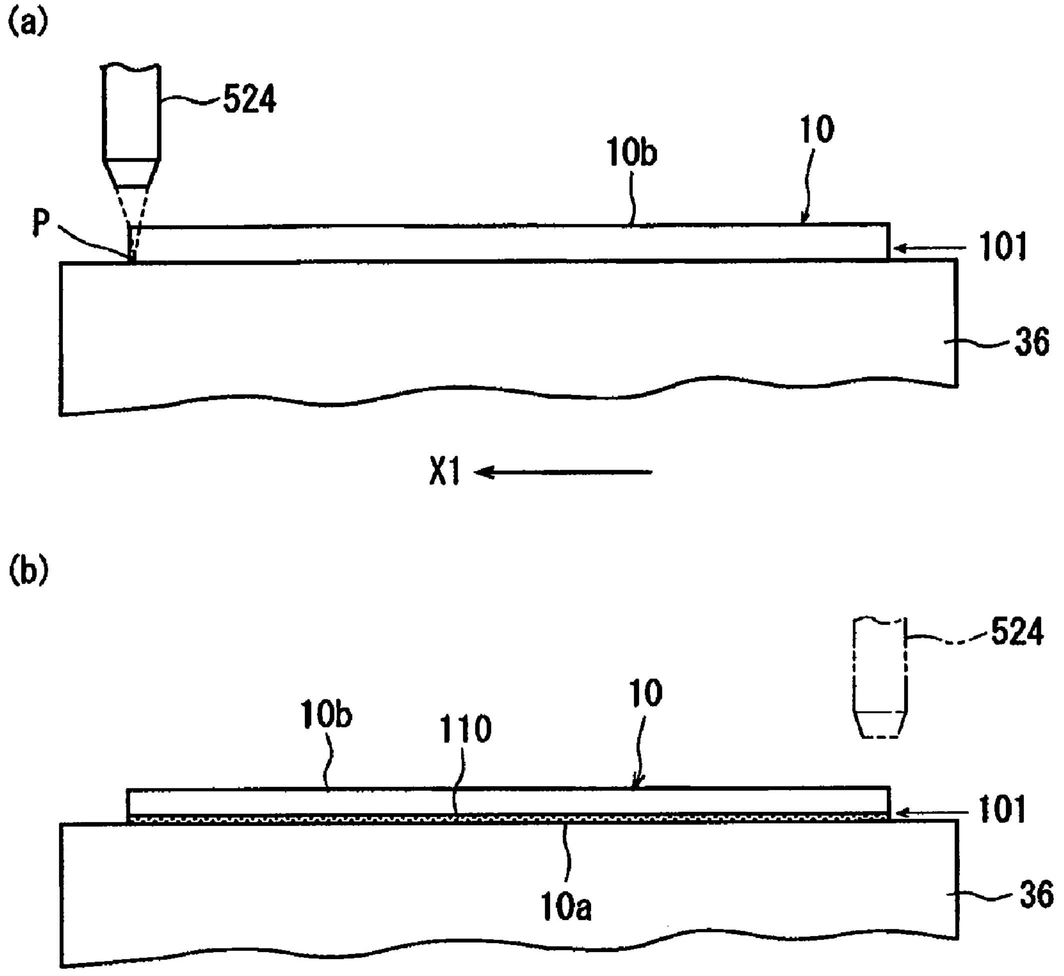

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 1 is confirmed.

Claims 2 and 4 are determined to be patentable as amended.

Claim 3, dependent on an amended claim, is determined to be patentable.

New claims 5-9 are added and determined to be patentable.

2. The laser processing method according to claim 1, wherein the wavelength of the laser beam is set to [1,300to] *more than 1,300 to* 1,600 nm.

4. A laser beam processing machine *for forming a deteriorated layer along dividing lines formed on a silicon wafer in the inside of the wafer, said processing machine* comprising a chuck table for holding [a] *the* wafer, a laser beam application means for applying a laser beam to the wafer held on the chuck table, and a processing-feed means for moving the chuck table and the laser beam application means relative to each other, wherein the laser beam application means comprises a laser beam oscillation means for oscillating a laser beam having a wavelength of 1,100 to 2,000 nm;

the laser beam application means outputs the laser beam at an average of 0.5 to 10 W, and a repetition frequency from 10 to 800 kHz; and the focusing spot diameter of the laser beam is in a range of 1.0 to 3.0 μm.

*5. A method of dividing a silicon wafer along dividing lines formed in the wafer, said method comprising:*

*applying a laser beam along the dividing lines to form a deteriorated layer inside of the wafer and along the dividing lines, wherein*

*the wavelength of the laser beam is set to 1,100 to 2,000 nm,*

*the average output of the laser beam is 0.5 to 10 W,*

*the repetition frequency of the laser beam is 10 to 800 kHz,*

*the focusing spot diameter of the laser beam is in a range of 1.0 to 3.0 μm; and*

*after formation of the deteriorated layer, dividing the wafer by applying external force along the dividing lines, wherein*

*the external force has a mean value of not greater than 0.7 Newtons.*

*6. The laser processing method according to claim 5, wherein the wavelength of the laser beam is set to more than 1,300 to 1,600 nm.*

*7. The laser processing method according to claim 6, wherein the wavelength of the laser beam is set to 1,340 to 1,550 nm.*

*8. The laser processing method according to claim 5, wherein the external force has a mean value of greater than or equal to 0.5 to less than or equal to 0.7 Newtons.*

*9. The laser processing method according to claim 6, wherein the laser beam is oscillated by an YV04 laser oscillator and the processing-feed rate of the laser beam is 10 to 1,000 mm/sec.*

* * * * *